(12) United States Patent
Jang et al.

(10) Patent No.: US 12,374,597 B2
(45) Date of Patent: Jul. 29, 2025

(54) SEMICONDUCTOR PACKAGE

(71) Applicant: Samsung Electronics Co., Ltd., Suwon-si (KR)

(72) Inventors: Ae-Nee Jang, Seoul (KR); In Hyo Hwang, Asan-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 18/643,144

(22) Filed: Apr. 23, 2024

(65) Prior Publication Data

US 2024/0274499 A1   Aug. 15, 2024

Related U.S. Application Data

(63) Continuation of application No. 17/387,212, filed on Jul. 28, 2021, now Pat. No. 12,002,731.

(30) Foreign Application Priority Data

Sep. 3, 2020 (KR) .................. 10-2020-0112056

(51) Int. Cl.
*H01L 23/373* (2006.01)
*H01L 23/00* (2006.01)
(Continued)

(52) U.S. Cl.
CPC ........ *H01L 23/3735* (2013.01); *H01L 23/367* (2013.01); *H01L 23/49816* (2013.01); *H01L 23/49822* (2013.01); *H01L 23/49833* (2013.01); *H01L 23/49838* (2013.01); *H01L 24/16* (2013.01); *H01L 24/32* (2013.01); *H01L 24/73* (2013.01); *H01L 25/0655* (2013.01); *H01L 25/105* (2013.01); *H01L 2224/16227* (2013.01); *H01L 2224/16237* (2013.01); *H01L 2224/32225* (2013.01); *H01L 2224/73204* (2013.01); *H01L 2225/1023* (2013.01);
(Continued)

(58) Field of Classification Search
CPC ............... H01L 23/3735; H01L 23/367; H01L 23/49816
See application file for complete search history.

(56) References Cited

U.S. PATENT DOCUMENTS 7,061,102 B2   6/2006  Eghan et al.
7,884,484 B2   2/2011  Yamano et al.
(Continued)

FOREIGN PATENT DOCUMENTS

JP         5129783 B2      1/2013
JP      2017-224672 A     12/2017
(Continued)

OTHER PUBLICATIONS

Office Action dated Sep. 26, 2024 in Korean Application No. 10-2020-0112056.
(Continued)

*Primary Examiner* — Errol V Fernandes
(74) *Attorney, Agent, or Firm* — Harness, Dickey & Pierce, P.L.C.

(57) ABSTRACT

Provided is a semiconductor package including a stiffener. The semiconductor package comprises a circuit board, a semiconductor chip on the circuit board, and a stiffener around the semiconductor chip, wherein the stiffener includes a first metal layer, a core layer, and a second metal layer sequentially stacked.

19 Claims, 15 Drawing Sheets

(51) Int. Cl.
  *H01L 23/367*  (2006.01)
  *H01L 23/498*  (2006.01)
  *H01L 25/065*  (2023.01)
  *H01L 25/10*   (2006.01)

(52) U.S. Cl.
  CPC ............... *H01L 2225/1058* (2013.01); *H01L 2225/107* (2013.01); *H01L 2225/1094* (2013.01); *H01L 2924/1431* (2013.01); *H01L 2924/1434* (2013.01); *H01L 2924/3511* (2013.01); *H01L 2924/3512* (2013.01)

(56) References Cited

U.S. PATENT DOCUMENTS

| | | |
|---|---|---|
| 8,810,024 B2 | 8/2014 | Lin et al. |
| 9,177,903 B2 | 11/2015 | Ang et al. |
| 10,297,518 B2 | 5/2019 | Lin et al. |
| 10,886,147 B1 | 1/2021 | Huang et al. |
| 2003/0029545 A1 | 2/2003 | Fantino et al. |
| 2014/0061893 A1 | 3/2014 | Saeidi et al. |
| 2018/0261528 A1 | 9/2018 | Chen et al. |
| 2019/0013303 A1 | 1/2019 | Goh et al. |

FOREIGN PATENT DOCUMENTS

| | | |
|---|---|---|
| KR | 10-0341104 B1 | 6/2002 |
| KR | 10-2008-0065386 A | 7/2008 |
| KR | 10-1245114 B1 | 3/2013 |
| TW | 200938042 A | 9/2009 |
| TW | 201839931 A | 11/2018 |
| TW | 202005008 A | 1/2020 |

OTHER PUBLICATIONS

Non-Final Office Action issued Mar. 30, 2023 in U.S. Appl. No. 17/387,212.
Non-Final Office Action issued Oct. 5, 2023 in U.S. Appl. No. 17/387,212.
Notice of Allowance issued Jan. 22, 2024 in U.S. Appl. No. 17/387,212.
Office Action issued Apr. 25, 2025 in Taiwanese Application No. 110129298.

SEMICONDUCTOR PACKAGE

CROSS-REFERENCE TO RELATED APPLICATIONS

This application is a Continuation of U.S. application Ser. No. 17/387,212, filed on Jul. 28, 2021, which claims priority from Korean Patent Application No. 10-2020-0112056 filed on Sep. 3, 2020 in the Korean Intellectual Property Office, and all the benefits accruing therefrom under 35 U.S.C. 119, the contents of each of which in its entirety are herein incorporated by reference.

BACKGROUND

1. Field of the Disclosure

The present disclosure relates to a semiconductor package. More specifically, the present disclosure relates to a semiconductor package including a stiffener.

2. Description of the Related Art

An interposer market is growing due to an increasing demand for high performance specifications and the adoption of high bandwidth memory (HBM). For example, in the case of a semiconductor package which uses a silicon-based interposer, the semiconductor package may be fabricated by surface-mounting a semiconductor chip on a silicon-based interposer and molding the mounted semiconductor chip with a molding material.

On the other hand, due to the recent demand for high specifications, the number of high bandwidth of memories on semiconductor packages has increased, and the size of the semiconductor packages is enlarged. This induces the problem of increasing the effect of stresses caused by a difference in the coefficient of thermal expansion (CTE), increasing the process difficulty of the semiconductor package, and lowering the yield of the semiconductor packages.

SUMMARY

Provided are some example embodiments of a semiconductor package in which a stress is lowered, by utilizing a stiffener whose thermal expansion coefficient (CTE) is easily adjusted.

However, aspects of the example embodiments are not restricted to the examples set forth herein. The aspects of the example embodiments will become more apparent to one of ordinary skill in the art by referencing to the detailed description below.

According to an aspect of the present disclosure, there is provided a semiconductor package comprising, a circuit board, a semiconductor chip on the circuit board and a stiffener around the semiconductor chip, the stiffener including a first metal layer, a core layer, and a second metal layer sequentially stacked.

According to another aspect of the present disclosure, there is provided a semiconductor package comprising, a circuit board, an interposer on an upper side of the circuit board, a first semiconductor chip on an upper side of the interposer, a second semiconductor chip on the upper side of the interposer, the second semiconductor chip isolated from direct contact with the first semiconductor chip, and a stiffener around the interposer on the upper side of the circuit board, the stiffener including a first metal layer, a core layer, and a second metal layer sequentially stacked.

According to another aspect of the present disclosure, there is provided a semiconductor package comprising, a circuit board including an insulating core, a first substrate pad exposed from a lower side of the insulating core, and a second substrate pad exposed from an upper side of the insulating core; a first bump on an upper side of the circuit board and connected to the second board pad; an interposer including a semiconductor film, a first interposer pad exposed from a lower side of the semiconductor film and connected to the first bump, an interlayer insulating film on an upper side of the semiconductor film, and a second interposer pad exposed from an upper side of the interlayer insulating film; a second bump on an upper side of the interposer and connected to the second interposer pad; a semiconductor chip including a chip pad connected to the second bump; and a stiffener around the interposer, the stiffener including a first metal layer, an organic layer, and a second metal layer sequentially stacked.

BRIEF DESCRIPTION OF THE DRAWINGS

The above and other aspects and features of the present disclosure will become more apparent by describing in detail exemplary embodiments thereof with reference to the attached drawings, in which.

DETAILED DESCRIPTION OF THE EMBODIMENTS

Hereinafter, semiconductor packages according to some example embodiments will be explained referring to FIGS. 1 to 15. Although the terms "first," "second," "third," etc., may be used herein to describe various elements, components, regions, layers, and/or sections, these elements, components, regions, layers, and/or sections, should not be limited by these terms. These terms are only used to distinguish one element, component, region, layer, or section, from another region, layer, or section. Thus, a first element, component, region, layer, or section, discussed below may be termed a second element, component, region, layer, or section, without departing from the scope of this disclosure.

Spatially relative terms, such as "lower," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, the device may be otherwise oriented (rotated 90 degrees or at other orientations) and the spatially relative descriptors used herein interpreted accordingly.

When the terms "about," and/or "similar" are used in this specification in connection with a numerical value, it is intended that the associated numerical value includes a manufacturing tolerance (e.g., ±10%) around the stated numerical value. Further, regardless of whether numerical values or shapes are modified as "about" and/or "similar" it will be understood that these values and shapes should be construed as including a manufacturing or operational tolerance (e.g., ±10%) around the stated numerical values or shapes.

Figure 1:
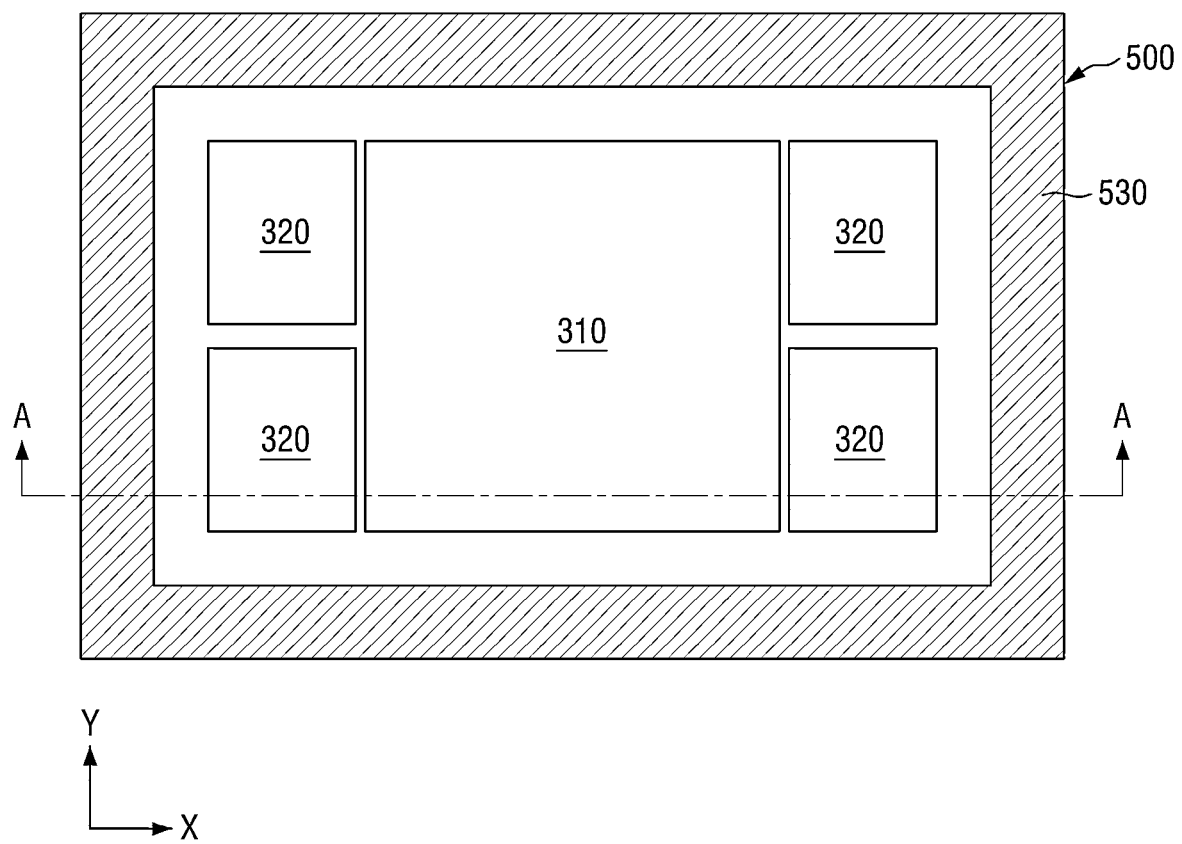
FIG. 1 is a schematic layout view of a semiconductor package according to some example embodiments.
Figure 2:
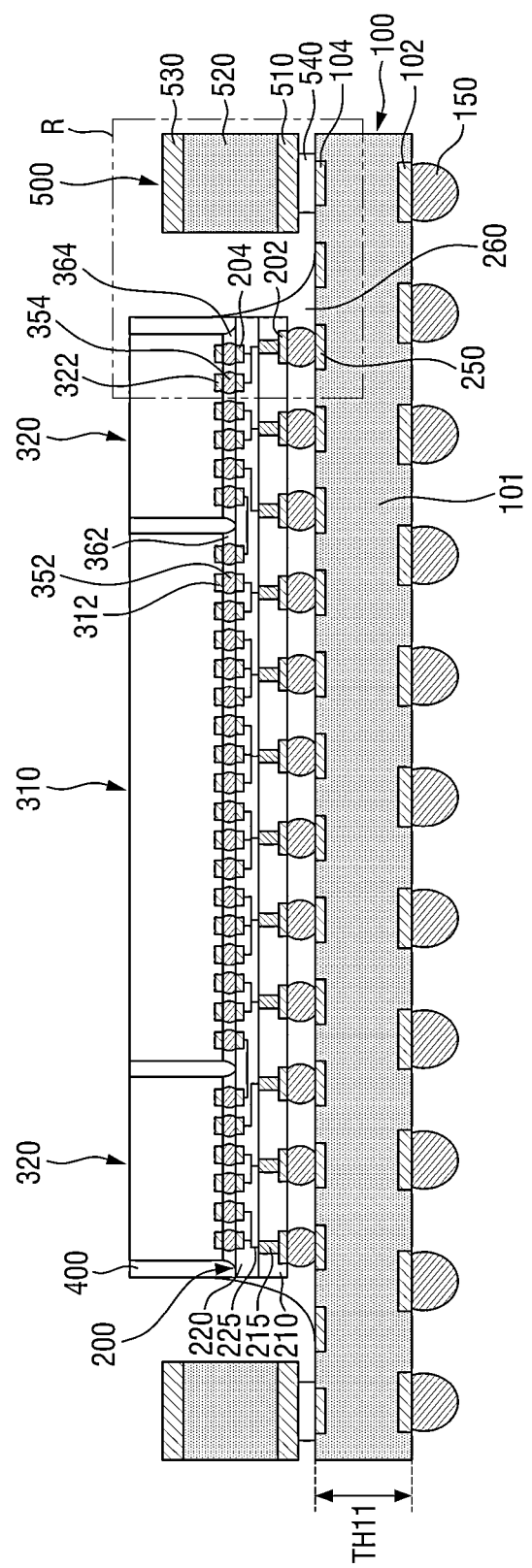
FIG. 2 is a schematic cross-sectional view taken along A-A of FIG. 1.

FIG. 1 is a schematic layout view of a semiconductor package according to some example embodiments. FIG. 2 is a schematic cross-sectional view taken along A-A of FIG. 1. FIGS. 3 to 8 are various enlarged views of the region R of FIG. 2.

In FIGS. 1 to 8, although a 2.5D package including a silicon interposer will be explained as an example of a semiconductor package according to some embodiments, this is merely an example, and the technical idea of the present disclosure is not limited thereto. The semiconductor packages according to some embodiments may, of course, be various, such as a 2.5D package, a 3D package and the like, and/or including an organic interposer.

Figure 3:
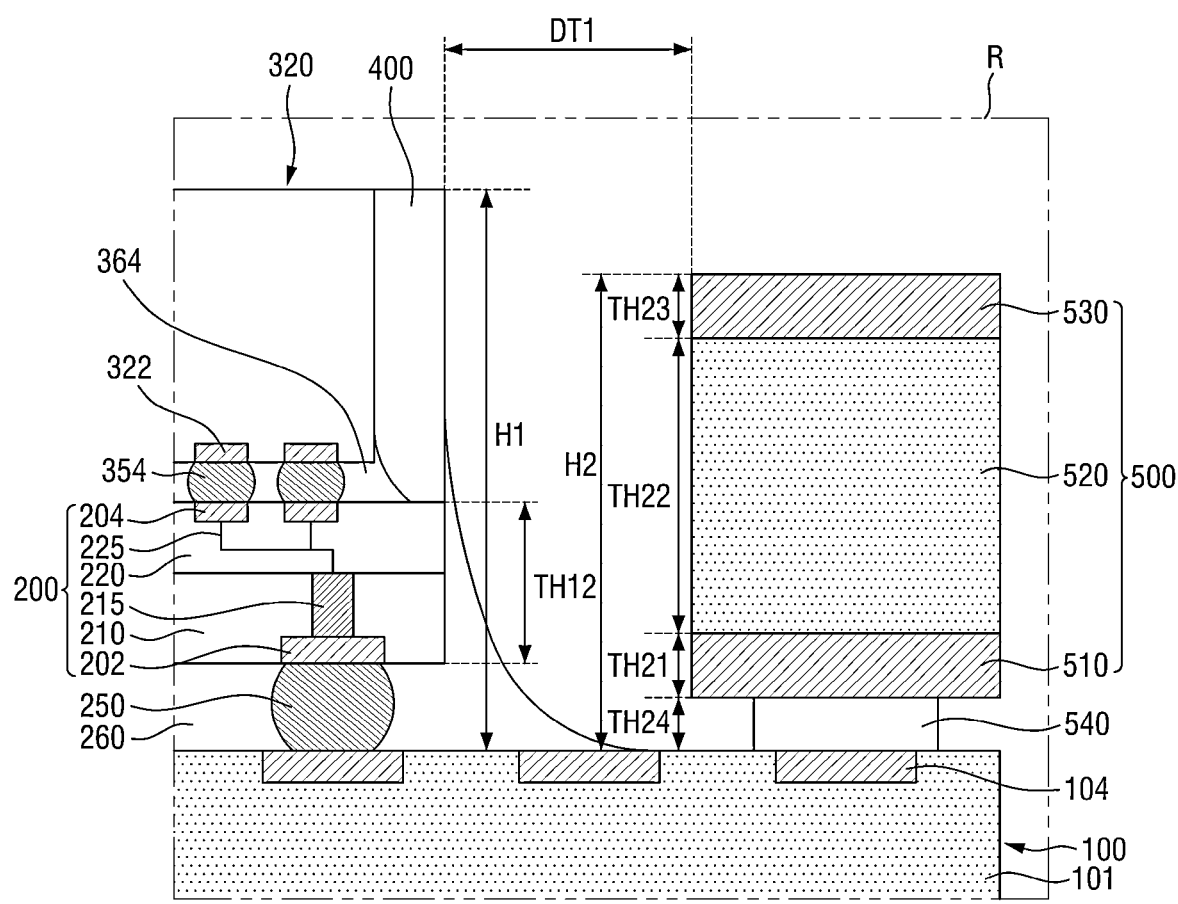
FIGS. 3 to 8 are various enlarged views of the region R of FIG. 2.

Referring to FIGS. 1 to 3, the semiconductor packages according to some embodiments may include a first circuit board 100, an interposer 200, a first semiconductor chip 310, a second semiconductor chip 320, a first molding member 400, and a stiffener 500.

The first circuit board 100 may be a packaging board. For example, the first circuit board 100 may be a printed circuit board (PCB). The first circuit board 100 may include a lower side and an upper side opposite to each other.

The first circuit board 100 may include an insulating core 101, a first board pad 102, and a second board pad 104. The first board pad 102 and the second board pad 104 may be used to electrically connect the first circuit board 100 to other components. For example, the first board pad 102 may be exposed from a lower side of the insulating core 101, and the second board pad 104 may be exposed from the upper side of the insulating core 101. The first board pad 102 and the second board pad 104 may include a conductive material. For example, the first board pad 102 and the second board pad 104 may include, but are not limited to, a metallic substance such as, for example, tin (Sn) gold (Au), silver (Ag), copper (Cu), aluminum (Al), and/or an alloy thereof.

Wiring patterns, for electrically connecting the first board pad 102 and the second board pad 104, may be formed in the insulating core 101. The wiring patterns may include a conductive material, such as a metallic substance like, but not limited to, like Sn, Au, Cu, Al, and/or an alloy thereof. Although the insulating core 101 is shown as a single layer, this is merely for clarity and convenience of explanation. For example, the insulating core 101 is made up of multi-layers, and a multi-layered wiring patterns may, of course, be formed inside the insulating core 101.

The first circuit board 100 may be mounted on a motherboard or the like of an electronic device (not illustrated). For example, a first connecting member 150 connected to the first board pad 102 may be formed. The first circuit board 100 may be mounted on a motherboard or the like of an electronic device through the first connecting member 150. For example, the first circuit board 100 may be, but is not limited to, a BGA (Ball Grid Array) board.

The first connecting member 150 may be, for example, but is not limited to, a solder bump. The solder may include, for example, a low-melting point conductive material. For example, the solder may include a metal (e.g., tin (Sn)) and/or an alloy (e.g., Sn and/or Cu alloys) with a low-melting point. The solder bump may include a eutectic alloy including the conductive material. The first connecting member 150 may have various shapes such as a land, a ball, a pin, and/or a pillar. The number, interval, arrangement form, and the like of the first connecting member 150 are not limited to those shown and may of course be various, depending on the design.

In some embodiments, the insulating core 101 may include a non-conductive material. For example, the insulating core 101 may include an organic matter. The insulating core 101 may include, for example, at least one of a photo imageable dielectric (PID), a thermoplastic resin, a thermoset binding film, and/or a photosensitive polyimide (PSPI). For example, the insulating core 101 may include a composite material, such as a pre-preg. The pre-preg is a composite fiber obtained by impregnating reinforcing fibers such as carbon fiber, glass fiber, and aramid fiber with a thermosetting polymer binder (e.g., epoxy resin) and/or a thermoplastic resin.

In some embodiments, the first circuit board 100 may include a copper clad laminate (CCL). For example, the first circuit board 100 may have a structure in which the copper clad laminate is stacked on one side or both sides of a thermosetting pre-preg (for example, pre-preg of a C-Stage).

In some embodiments, the first circuit board 100 may have a relatively thick thickness. For example, a thickness TH11 of the first circuit board 100 may be about 1.5 mm or more. As an example, the thickness TH11 of the first circuit board 100 may be about 1.5 mm to about 3.0 mm.

The interposer 200 may be placed on the upper side of the first circuit board 100. The interposer 200 may be an organic and/or an inorganic interposer. For example, the interposer may be, but is not limited to, a silicon interposer. The interposer 200 may include the lower side and the upper side opposite to each other. The interposer 200 facilitates the connection between the first circuit board 100 and semiconductor chips 310 and 320 to be described later, and may prevent and/or mitigate warpage of the semiconductor package. A thickness TH12 of the interposer 200 may be less than the thickness TH11 of the first circuit board 100. For example, the thickness of the TH12 of the interposer 200 may be, but is not limited to, from about 0.05 mm to about 0.5 mm.

The interposer 200 may include a first interposer pad 202 and a second interposer pad 204. Each of the first interposer pad 202 and the second interposer pad 204 may each be used to electrically connect the interposer 200 to other components. For example, the first interposer pad 202 may be exposed from the lower side of the interposer 200, and the second interposer pad 204 may be exposed from the upper side of the interposer 200. The first interposer pad 202 and the second interposer pad 204 may include a conductive material, such as a metallic substance like, but not limited to, like Sn, Au, Cu, Al, and/or an alloy thereof. Wiring patterns for electrically connecting the first interposer pad 202 and the second interposer pad 204 may be formed in the interposer 200. The wiring patterns may include a conductive material, such as a metallic substance like, but not limited to, like Sn, Au, Cu, Al, and/or an alloy thereof.

The interposer 200 may be mounted on the upper side of the first circuit board 100. For example, a second connecting member 250 may be formed between the first circuit board 100 and the interposer 200. The second connecting member 250 may connect the second board pad 104 and the first interposer pad 202. The first circuit board 100 and the interposer 200 may be electrically connected accordingly.

The second connecting member 250 may include, but is not limited to, connection pads and/or solder bumps. The solder may include, for example, a low-melting point conductive material. For example, the solder may include a metal (e.g., tin (Sn)) and/or an alloy (e.g., Sn and/or Cu alloys) with a low-melting point. The solder bump may include a eutectic alloy including the conductive material. The second connecting member 250 may have various shapes such as a land, a ball, a pin, and/or a pillar. The second connecting member 250 may be formed of a single layer or multi-layers. When the second connecting member 250 is formed of a single layer, the second connecting member 250 may optionally include tin-silver (Sn—Ag) solder and/or copper (Cu). When the second connecting member 250 is formed of multi-layers, the second connecting member 250 may include solder and/or a filler. For example, a multi-layer second connecting member may include a conductive filler (e.g., copper (Cu)) and solder. The number, interval, arrangement form, and the like of the second connecting member 250 are not limited to those shown, and may, of course, be various depending on the design.

In some embodiments, the interposer 200 may include a semiconductor film 210, a penetration via 215, an interlayer insulating film 220, and a redistribution pattern 225.

The semiconductor film 210 may be, for example, but is not limited to, a silicon film. The penetration via 215 may penetrate the semiconductor film 210. For example, the penetration via 215 may extend from the upper side of the semiconductor film 210 and may be connected to the first interposer pad 202. The penetration via 215 may include a conductive material, such as a metallic substance like, but not limited to, like Sn, Au, Cu, Al, and/or an alloy thereof.

The interlayer insulating film 220 may cover the upper side of the semiconductor film 210. The interlayer insulating film 220 may include, for example, but is not limited to, at least one of silicon oxide, silicon nitride, silicon oxynitride and a low-k material having a lower dielectric constant than silicon oxide. The redistribution pattern 225 may be formed in the interlayer insulating film 220. The redistribution pattern 225 may electrically connect the penetration via 215 to the second interposer pad 204.

In some embodiments, a first underfill 260 may be formed between the first circuit board 100 and the interposer 200. The first underfill 260 may fill a space between the first circuit board 100 and the interposer 200. Further, the first underfill 260 may cover the second connecting member 250. The first underfill 260 may prevent and/or mitigate breakage or the like of the interposer 200, by fixing the interposer 200 onto the first circuit board 100. The first underfill 260 may include, but is not limited to, an insulating polymeric material such as an epoxy-molding compound (EMC).

Figure 15:
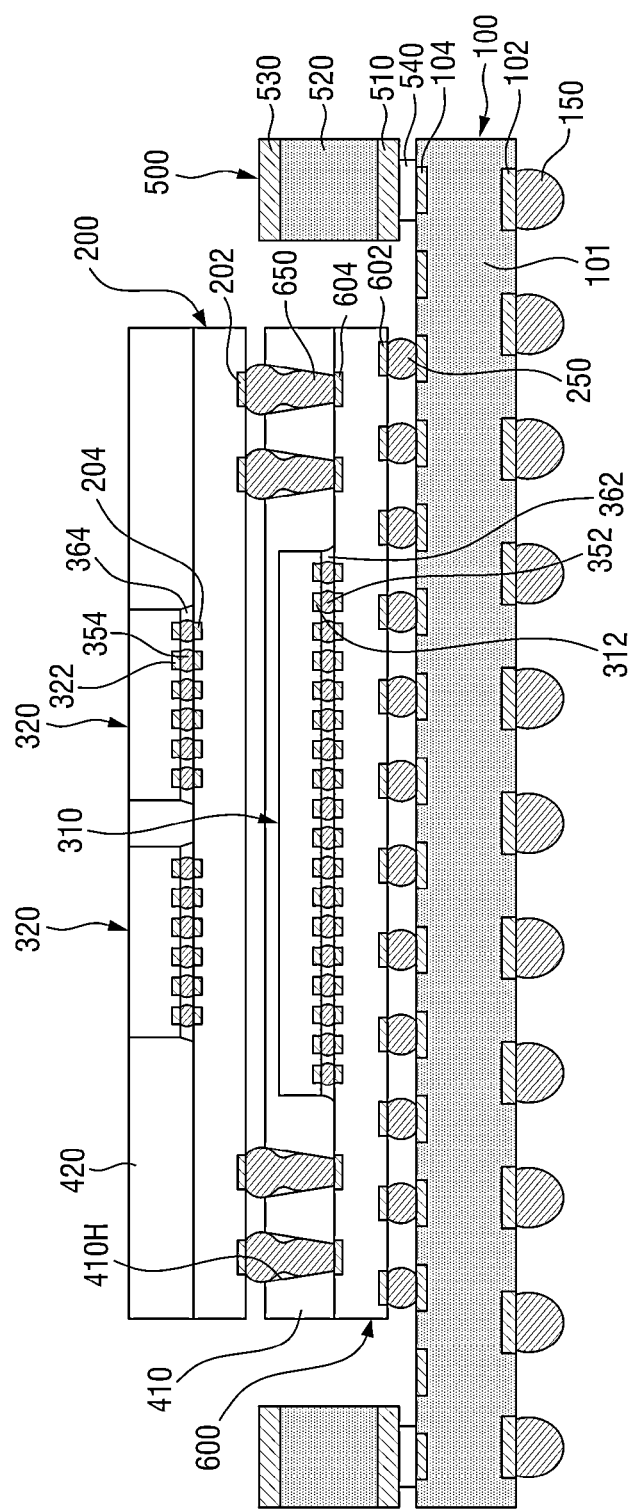
FIG. 15 is a schematic cross-sectional view taken along B-B of FIG. 14.

The first semiconductor chip 310 and the second semiconductor chip 320 may be placed on the upper side of the interposer 200 and may be spaced apart from each other. Each of the first semiconductor chip 310 and the second semiconductor chip 320 may be an integrated circuit (IC) in which hundreds to millions or more semiconductor elements are integrated in a single chip. The semiconductor package may be a 2.5D package (e.g., wherein the first semiconductor chip 310 and the second semiconductor chip 320 are arranged in a single plane) or a 3D package (e.g., wherein at least one of the first semiconductor chip 310 and the second semiconductor chip 320 is included in a stack of semiconductor chips, for example, as illustrated in FIG. 15).

In some embodiments, the first semiconductor chip 310 may be a logic semiconductor chip. For example, the first semiconductor chip 310 may be, but is not limited to, an application processor (AP) such as a CPU (Central Processing Unit), a GPU (Graphic Processing Unit), a FPGA (Field-Programmable Gate Array), a digital signal processor, an encryption processor, a microprocessor, a microcontroller, and/or an ASIC (Application-Specific IC).

In some embodiments, the second semiconductor chip 320 may be a memory semiconductor chip. For example, the second semiconductor chip 320 may be a volatile memory such as a DRAM (dynamic random access memory) and/or a SRAM (static random access memory), and/or a nonvolatile memory such as a flash memory, a PRAM (Phase-change Random Access Memory), a MRAM (Magnetoresistive Random Access Memory), a FeRAM (Ferroelectric Random Access Memory) and/or a RRAM (Resistive Random Access Memory).

As an example, the first semiconductor chip 310 may be an ASIC such as a GPU, and the second semiconductor chip 320 may be a stack memory such as a High Bandwidth Memory (HBM). Such a stack memory may be in the form of a plurality of stacked integrated circuits. The stacked integrated circuits may be electrically connected to each other through a TSV (Through Silicon Via) or the like.

The semiconductor package may include more than one of each of the first semiconductor chip 310 and/or the second semiconductor chip 320. In some embodiments, the semiconductor package may include a larger number of second semiconductor chips 320 than the first semiconductor chip(s) 310. For example, a plurality of second semiconductor chips 320 may be placed around the first semiconductor chip 310. As an example, as shown in FIG. 1, two second semiconductor chips 320 may be placed on both sides of the first semiconductor chip 310.

The first semiconductor chip 310 may include a first chip pad 312. The first chip pad 312 may be used to electrically connect the first semiconductor chip 310 to other components. For example, the first chip pad 312 may be exposed from the lower side of the first semiconductor chip 310.

The second semiconductor chip 320 may include a second chip pad 314. The second chip pad 314 may be used to electrically connect the second semiconductor chip 320 to other components. For example, the second chip pad 314 may be exposed from the lower side of the second semiconductor chip 320.

The first chip pad 312 and the second chip pad 314 may include a conductive material, such as a metallic substance like, but not limited to, like Sn, Au, Cu, Al, and/or an alloy thereof.

The first semiconductor chip 310 and the second semiconductor chip 320 may be mounted on the upper side of the interposer 200. For example, a third connecting member 352 may be formed between the interposer 200 and the first semiconductor chip 310. The third connecting member 352 may connect some of the plurality of second interposer pads 204 to the first chip pad 312. The interposer 200 and the first semiconductor chip 310 may be electrically connected to each other accordingly. Further, for example, a fourth connecting member 354 may be formed between the interposer 200 and the second semiconductor chip 320. The fourth connecting member 354 may connect some others of the plurality of second interposer pads 204 and the second chip pad 314. The interposer 200 and the second semiconductor chip 320 may be electrically connected accordingly.

In some embodiments, some of the redistribution patterns 225 may electrically connect the third connecting member 352 and the fourth connecting member 354. For example, some of the redistribution patterns 225 may connect the second interposer pad 204 connected to the third connecting member 352 and the second interposer pad 204 connected to the fourth connecting member 354. The first semiconductor chip 310 and the second semiconductor chip 320 may be electrically connected accordingly.

The third connecting member 352 and the fourth connecting member 354 may include, but are not limited to, solder bumps. The solder may include, for example, a low-melting point conductive material. For example, the solder may include a metal (e.g., tin (Sn)) and/or an alloy (e.g., Sn and/or Cu alloys) with a low-melting point. The solder bump may include a eutectic alloy including the conductive material. The third connecting member 352 and the fourth connecting member 354 may have various shapes such as a land, a ball, a pin, and a pillar, respectively. The third connecting member 352 and the fourth connecting member 354 may include, but are not limited to, UBM (Under Bump Metallurgy), respectively.

In some embodiments, a second underfill 362 may be formed between the interposer 200 and the first semiconductor chip 310, and a third underfill 364 may be formed between the interposer 200 and the second semiconductor chip 320. The second underfill 362 may fill the space between the interposer 200 and the first semiconductor chip 310, and the third underfill 364 may fill the space between the interposer 200 and the second semiconductor chip 320. Further, the second underfill 362 may cover the third connecting member 352, and the third underfill 364 may cover the fourth connecting member 354. The second underfill 362 and the third underfill 364 may prevent and/or mitigate breakage or the like of the semiconductor chips 310 and 320 by fixing the semiconductor chips 310 and 320 onto the interposer 200. The second underfill 362 and the third underfill 364 may each include, but are not limited to, an insulating polymeric material such as EMC. The second underfill 362 and the third underfill 364 may be separate and/or joined.

The first molding member 400 may be formed on the upper side of the interposer 200. The first molding member 400 may be formed to cover at least a part of the semiconductor chips 310 and 320. For example, the first molding member 400 may cover sides of the first semiconductor chip 310, sides of the second semiconductor chip 320, the second underfill 362 and/or the third underfill 364. Although the first molding member 400 is only shown as exposing the upper side of the first semiconductor chip 310 and the upper side of the second semiconductor chip 320, this is merely an example, and the first molding member 400 may, of course, cover the upper side of the first semiconductor chip 310 and the upper side of the second semiconductor chip 320.

The first molding member 400 may include, but is not limited to, an insulating polymeric material such as an EMC. In some embodiments, the first underfill 260, the second underfill 362, and the third underfill 364 may include a substance different from the first molding member 400. For example, the first underfill 260, the second underfill 362, and the third underfill 364 may include an insulating substance having fluidity superior to the first molding member 400. Accordingly, the first underfill 260, the second underfill 362, and the third underfill 364 may efficiently fill a narrow space between the first circuit board 100 and the interposer 200 and/or between the interposer 200 and the semiconductor chips 310 and 320.

The stiffener 500 may be placed on the upper side of the first circuit board 100. The stiffener 500 may be placed around the semiconductor chips 310 and 320 and/or around the interposer 200. For example, the stiffener 500 may be placed along the edge of the first circuit board 100. As an example, the stiffener 500 may include a first portion extending in a first direction X parallel to the upper side of the first circuit board 100, and a second portion extending in a second direction Y parallel to the upper side of the first circuit board 100 and intersecting the first direction X.

The stiffener 500 may be spaced apart from the semiconductor chips 310 and 320 and/or the interposer 200. The distance between the stiffener 500 and the semiconductor chips 310 and 320 and/or the interposer 200 may be predetermined (or otherwise determined). A spaced distance DT1 of the stiffener 500 from the interposer 200 may be, for example, but is not limited to, about 5 mm to about 7 mm.

The stiffener 500 may include a first metal layer 510, a core layer 520, and a second metal layer 530 that are sequentially stacked on the upper side of the first circuit board 100. The core layer 520 may be placed around the semiconductor chips 310 and 320 or around the interposer 200. For example, the core layer 520 may be placed along the edge of the first circuit board 100. The first metal layer 510 may cover at least a part of the lower side of the core layer 520. The second metal layer 530 may cover at least a part of the upper side of the core layer 520.

The core layer 520 may include a substance similar to the insulating core 101 of the first circuit board 100. In some embodiments, the core layer 520 may be an organic layer including an organic matter. For example, the core layer 520 may include at least one of a photo imageable dielectric (PID), a thermoplastic resin, a thermoset binding film, and/or a photosensitive polyimide (PSPI). For example, the insulating core 101 may include a composite material, such as a pre-preg. As an example, the core layer 520 may be a thermosetting pre-preg (e.g., pre-preg of a C-Stage). The core layer 520 may have a coefficient of thermal expansion (CTE) similar to the CTE of the first circuit board 100. For example, the core layer 520 may have the same CTE as the first circuit board 100 and/or a CTE such that the stiffener 500 and the first circuit board 100 expand at comparable rates. As a result, the stiffener 500 including the core layer 520 may reduce a difference in the coefficient of thermal expansion (CTE) from the first circuit board 100 including the insulating core 101.

In some embodiments, the core layer 520 may include the same substance as the insulating core 101. However, the technical idea of the present disclosure is not limited thereto, and the core layer 520 and the insulating core 101 may include different substances from each other.

In some embodiments, the stiffener 500 may include a copper clad laminate (CCL). For example, the first metal layer 510 and the second metal layer 530 may each include copper (Cu). As an example, the stiffener 500 may have a structure in which the first metal layer 510 and/or the second metal layer 530 including a copper laminate are stacked on both sides of the core layer 520 including the thermosetting pre-preg. The first metal layer 510 and the second metal layer 530 may improve the heat dissipation characteristics of the semiconductor package and prevent and/or mitigate the warpage of the semiconductor package.

In some embodiments, each of the first metal layer 510 and/or the second metal layer 530 may include the same substance as the first board pad 102 and/or the second board pad 104. However, the technical idea of the present disclosure is not limited thereto, and each of the first metal layer 510 and/or the second metal layer 530 may include a substance different from the first board pad 102 and/or the second substrate pad 104.

A thickness TH21 of the first metal layer 510, a thickness TH22 of the core layer 520, and a thickness TH23 of the second metal layer 530 are not limited to those shown, and may of course change depending on the design. For example, the thickness TH21 of the first metal layer 510, the thickness TH22 of the core layer 520, and the thickness TH23 of the second metal layer 530 may be various, depending on the arrangement of the interposer 200, the arrangement of semiconductor chips 310 and 320, the substances forming the insulating core 101 or the like.

In some embodiments, the thickness TH21 of the first metal layer 510 and the thickness TH23 of the second metal layer 530 may be the same and/or about the same.

In some embodiments, the thickness TH22 of the core layer 520 may be greater than the thickness TH21 of the first metal layer 510 and the thickness TH23 of the second metal layer 530. In some embodiments, the thickness TH21 of the first metal layer 510 relative to the thickness TH22 of the core layer 520, and the thickness TH23 of the second metal layer 530 relative to the thickness TH22 of the core layer 520 may each be about 2% to about 20%, respectively. The thickness TH21 of the first metal layer 510 and the thickness TH23 of the second metal layer 530 may be the same and/or different.

When the thickness TH21 of the first metal layer 510 relative to the thickness TH22 of the core layer 520, and the thickness TH23 of the second metal layer 530 relative to the thickness TH22 of the core layer 520 are smaller than about 2%, respectively, the heat dissipation characteristics of the semiconductor package may be degraded, and the warpage of the semiconductor package may become severe. When the thickness TH21 of the first metal layer 510 relative to the thickness TH22 of the core layer 520, and the thickness TH23 of the second metal layer 530 relative to the thickness TH22 of the core layer 520 are greater than about 20%, respectively, the difference in coefficient of thermal expansion (CTE) between the stiffener 500 and the first circuit board 100 may be increased, and the stress of the semiconductor package may become severe.

As an example, the thickness TH22 of the core layer 520 may be about 500 μm to about 1000 μm, and each of the thickness TH21 of the first metal layer 510 and the thickness TH22 of the core layer 520 may be about 10 μm to about 200 μm.

The stiffener 500 may be attached onto the upper side of the first circuit board 100. For example, an adhesive layer 540 may be formed between the first circuit board 100 and the stiffener 500. The adhesive layer 540 may attach the stiffener 500 onto the upper side of the first circuit board 100. A thickness TH24 of the adhesive layer 540 may be, for example, but is not limited to, about 10 μm to about 100 μm.

In some embodiments, the adhesive layer 540 may include a TIM (thermal interface material) substance. The TIM substance may include a resin of monomer or polymer having thermally conductive particles. For example, the adhesive layer 540 may include, but is not limited to, at least one of aluminum oxide (AlO), zinc oxide (ZnO), thermosetting resins, and/or combinations thereof.

A height H1 of the upper side of the first molding member 400, and/or of the upper side of the semiconductor chips 310 and 320, and a height H2 of the upper side of the stiffener 500 are not limited to that shown, and may of course change depending on the design. For example, the height H1 and the height H2 may be various, depending on the arrangement of the interposer 200, the arrangement of semiconductor chips 310 and 320, the substances forming the insulating core 101 or the like.

In some embodiments, the height H2 of the upper side of the stiffener 500 may be less than or the same as the height H1 of the height of the upper side of the first molding member 400 and/or of the upper side of the semiconductor chips 310 and 320. In some embodiments, the height H2 of the upper side of the stiffener 500 relative to the height H1 of the upper side of the first molding member 400 and/or of the upper side of the semiconductor chips 310 and 320 may be about 70% to about 100%. As an example, the height H1 of the upper side of the first molding member 400 and/or of the upper side of the second semiconductor chip 320 may be about 750 μm to 850 μm, and the height H2 of the upper side of the second metal layer 530 may be about 650 μm to 750 μm.

Recently, the number of high bandwidth memories included in semiconductor packages has increased due to the high specifications demands of set, and, as a result, the size (e.g., an area and/or a thickness) of the semiconductor packages is enlarged. This induces the problem of increasing the stress caused by the difference in coefficient of thermal expansion (CTE), increasing the process difficulty of the semiconductor package, and lowering the yield. For example, a difference in coefficient of thermal expansion (CTE) between the printed circuit board, the interposer, and the stiffener may increase stress of the semiconductor package and cause defects such as cracks in the underfill and/or connections.

However, since the semiconductor package according to some embodiments is equipped with the stiffener 500 including the first metal layer 510, the core layer 520 and the second metal layer 530, it is possible to reduce thermal stresses of the package. For example, as explained above, the core layer 520 between the first metal layer 510 and the second metal layer 530 may include the substance similar to the insulating core 101. Accordingly, it is possible to provide a semiconductor package in which the difference in coefficient of thermal expansion between the first circuit board 100 and the stiffener 500 is reduced and stress is lowered.

Further, since the semiconductor package according to some embodiments is equipped with the stiffener 500 including the first metal layer 510, the core layer 520 and the second metal layer 530, it is possible to reduce the production cost of the semiconductor package. For example, as explained above, since the stiffener 500 may include an organic layer (e.g., in the core layer 520), it can be provided at a lower price than a stiffener including only a metal layer. As a result, a semiconductor package with reduced production costs may be provided.

Figure 4:
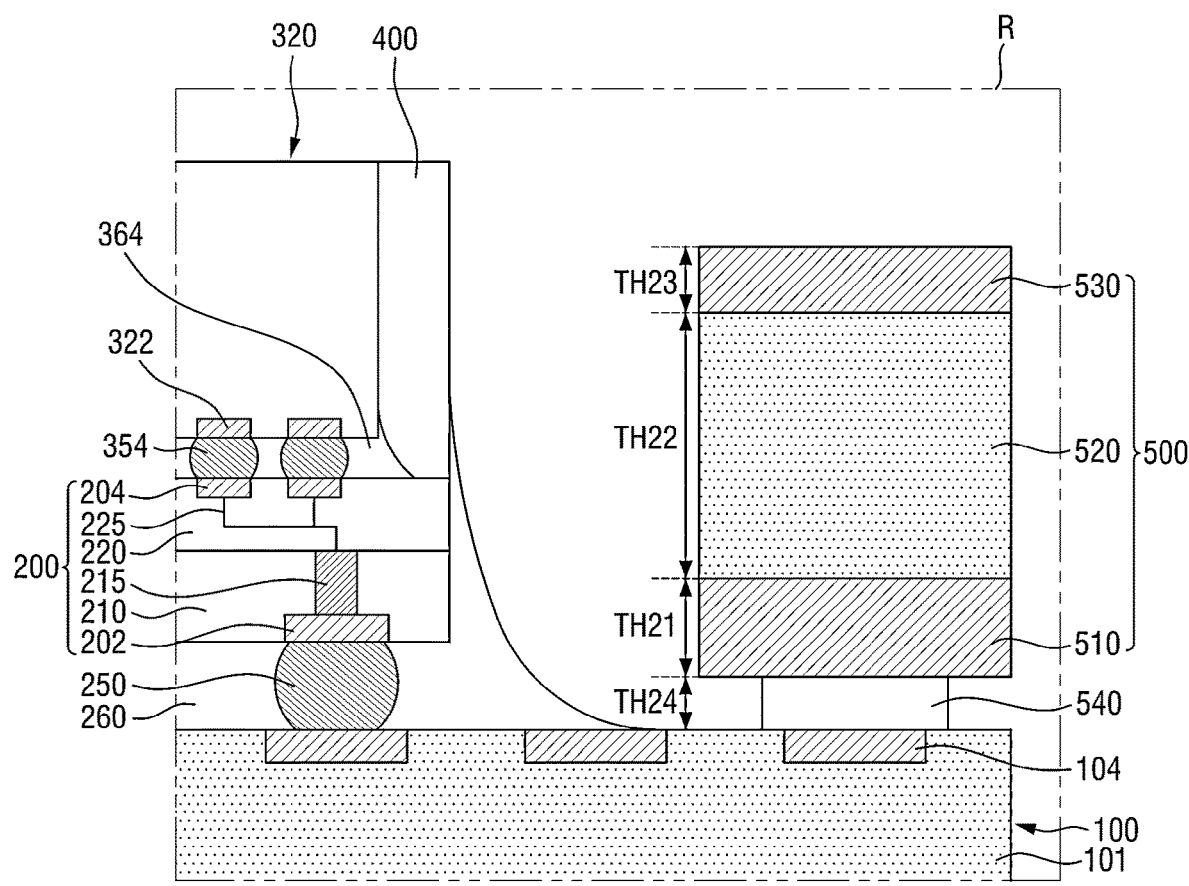

Referring to FIGS. 1, 2 and 4, in the semiconductor package according to some embodiments, the thickness TH21 of the first metal layer 510 may differ from the thickness TH23 of the second metal layer 530.

In FIG. 4, although the thickness TH21 of the first metal layer 510 is only shown as being greater than the thickness TH23 of the second metal layer 530, this is merely an example. For example, the thickness TH21 of the first metal layer 510 may be smaller than the thickness TH23 of the second metal layer 530.

Figure 5:
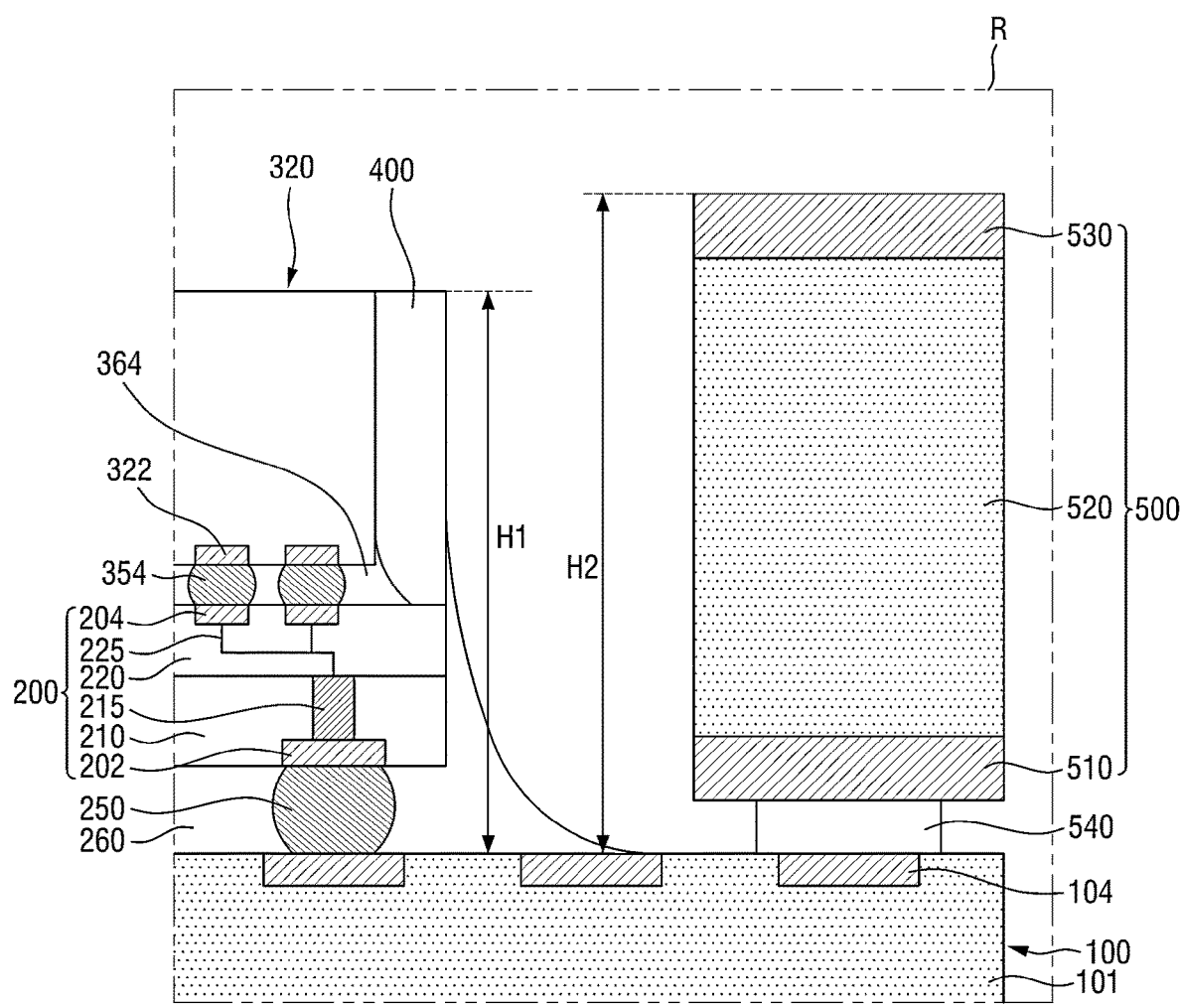

Referring to FIGS. 1, 2 and 5, in the semiconductor package according to some embodiments, the height H2 of the upper side of the stiffener 500 may be greater than the height H1 of the upper side of the first molding member 400 and/or of the upper side of the semiconductor chips 310 and 320.

For example, the height H2 of the upper side of the second metal layer 530 may be greater than the height H1 of the upper side of the first molding member 400 and/or of the upper side of the second semiconductor chip 320.

Figure 6:
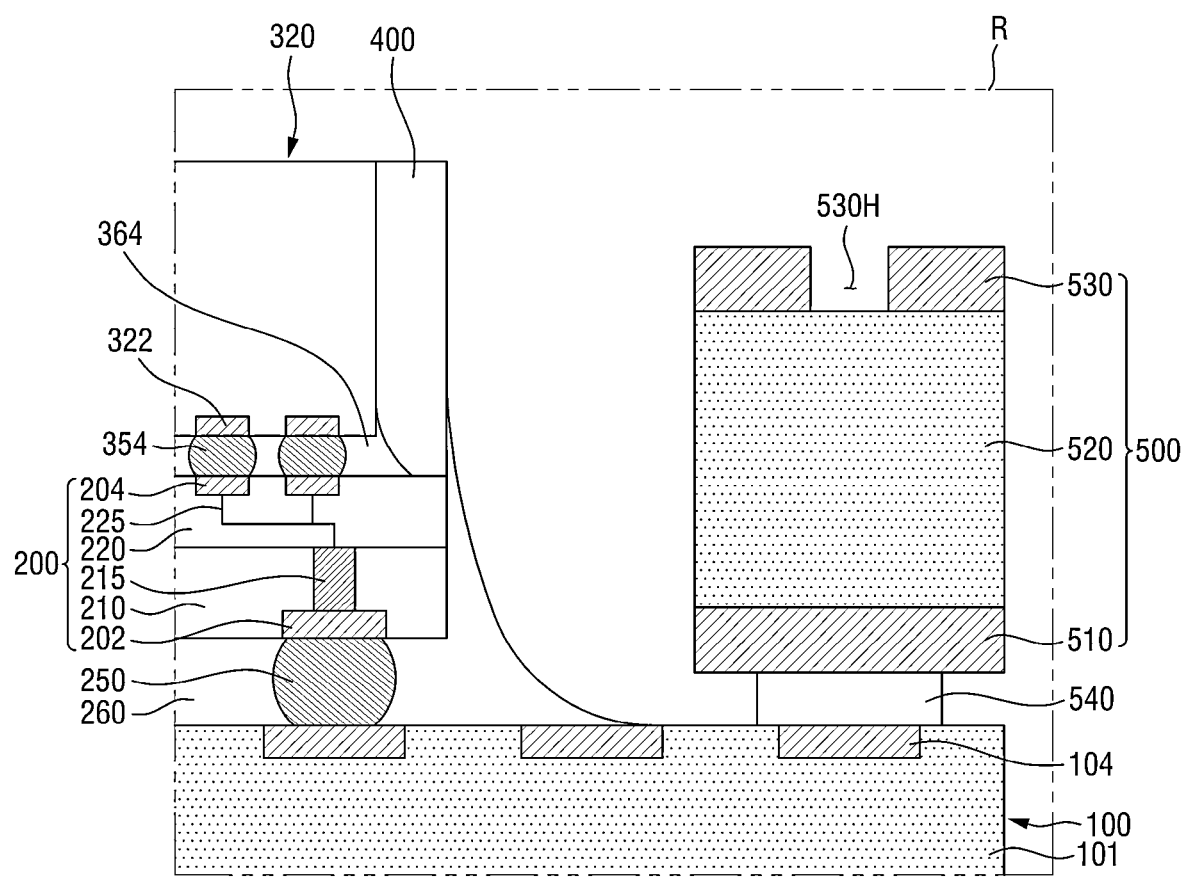

Referring to FIGS. 1, 2 and 6, in the semiconductor package according to some embodiments, the first metal layer 510 may expose a part of the upper side of the core layer 520.

For example, the second metal layer 530 may include a first opening 530H. A part of the upper side of the core layer 520 may be exposed from the second metal layer 530 through the first opening 530H.

The size and arrangement of the first opening 530H are not limited to those shown, and may of course change depending on the design. For example, the size and arrangement of the first opening 530H may be various, depending on the arrangement of the interposer 200, the arrangement of the semiconductor chips 310 and 320, the substance forming the insulating core 101, and the like.

Figure 7:
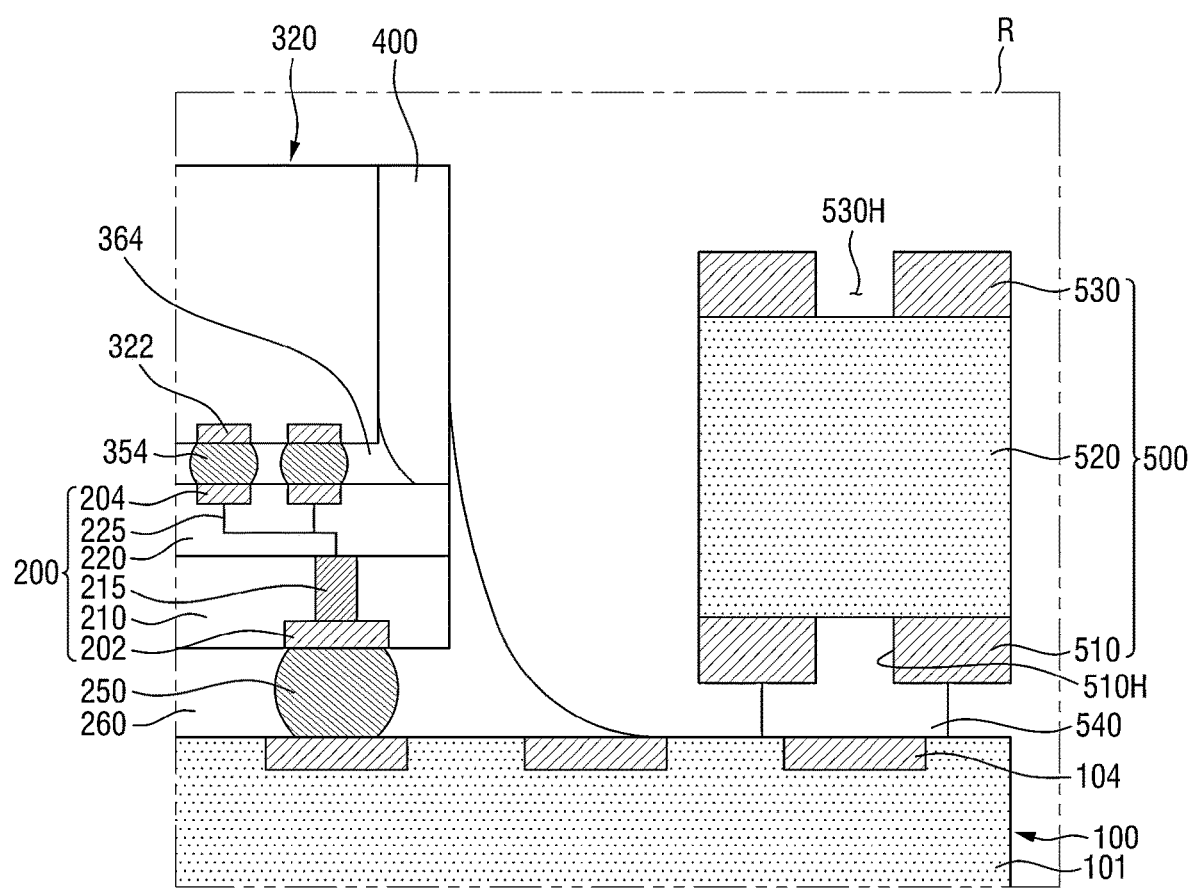

Referring to FIGS. 1, 2 and 7, in the semiconductor package according to some embodiments, the first metal layer 510 may expose a part of the lower side of the core layer 520.

For example, the first metal layer 510 may include a second opening 510H. A part of the lower side of the core layer 520 may be exposed from the first metal layer 510 through the second opening 510H.

The size and arrangement of the second opening 510H are not limited to those shown and may of course vary depending on the design. For example, the size and arrangement of the second opening 510H may be various, depending on the arrangement of the interposer 200, the arrangement of the semiconductor chips 310 and 320, the substance forming the insulating core 101, and the like.

In some embodiments, a part of the adhesive layer 540 may come into contact with the lower side of the core layer 520 through the second opening 510H.

Figure 8:
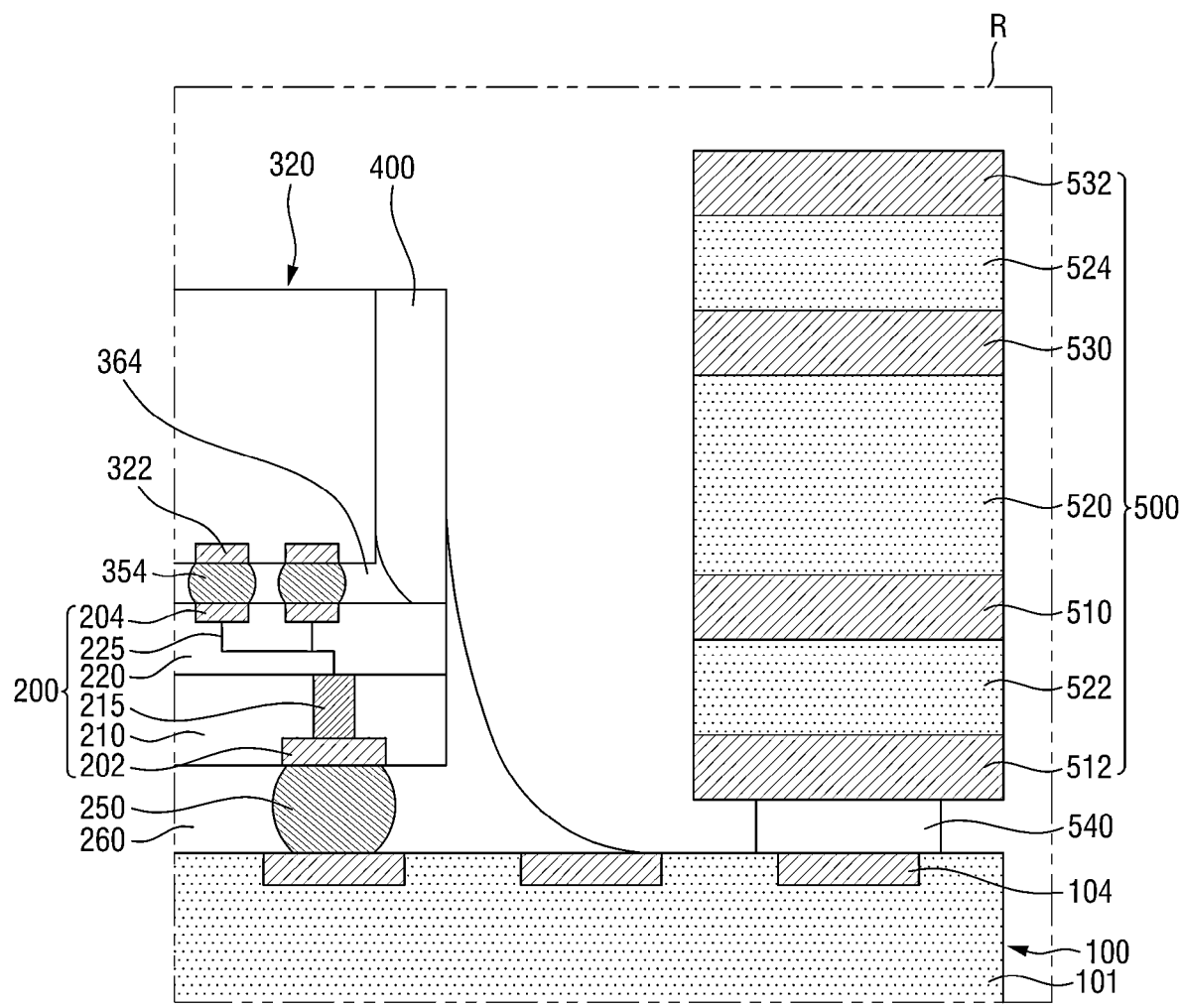

Referring to FIGS. 1, 2 and 8, in the semiconductor package according to some embodiments, the stiffener 500 may further include a third metal layer 512, a first insulating layer 522, a fourth metal layer 532 and a second insulating layer 524.

The third metal layer 512 may be formed under the first metal layer 510. For example, the third metal layer 512 may be attached onto the adhesive layer 540. The first insulating layer 522 may be interposed between the first metal layer 510 and the third metal layer 512. For example, the first insulating layer 522 may attach the third metal layer 512 under the first metal layer 510.

The fourth metal layer 532 may be formed on the first metal layer 510. The second insulating layer 524 may be interposed between the first metal layer 510 and the fourth metal layer 532. For example, the second insulating layer 524 may attach the fourth metal layer 532 onto the first metal layer 510.

In some embodiments, the first insulating layer 522 and the second insulating layer 524 may be organic layers, each including an organic matter. For example, the first insulating layer 522 and the second insulating layer 524 may each include pre-preg. The first insulating layer 522 and the second insulating layer 524 may include the same substance as the respective core layer 520, and/or may include a substance different from the core layer 520.

In some embodiments, the third metal layer 512 and the fourth metal layer 532 may each include copper (Cu). As an example, the stiffener 500 may have a structure in which the third metal layer 512 and the fourth metal layer 532 are stacked as multi-layers on both sides of a copper clad laminate (CCL).

The thickness of the first metal layer 510, the thickness of the core layer 520, the thickness of the second metal layer 530, the thickness of the third metal layer 512, the thickness of the first insulating layer 522, the thickness of the fourth metal layer 532 and the thickness of the second insulating layer 524 are not limited to those shown, but may of course vary depending on the design. For example, the thickness of the first metal layer 510, the thickness of the core layer 520, the thickness of the second metal layer 530, the thickness of the third metal layer 512, the thickness of the first insulating layer 522, the thickness of the fourth metal layer 532 and the thickness of the second insulating layer 524 may be various, depending on the arrangement of the interposer 200, the arrangement of the semiconductor chips 310 and 320, the substance forming the insulating core 101 and the like. Though illustrated as only including a first insulating layers 522, a second insulating layers 524, a third metal layer 512, and a fourth metal layer 532, the number of each is not limited to those shown, but may of course vary depending on the design.

FIGS. 9 to 13 are various schematic layout views for explaining a semiconductor package according to some embodiments. For convenience of explanation, repeated parts of contents explained above using FIGS. 1 to 8 will be briefly explained or omitted.

Figure 9:
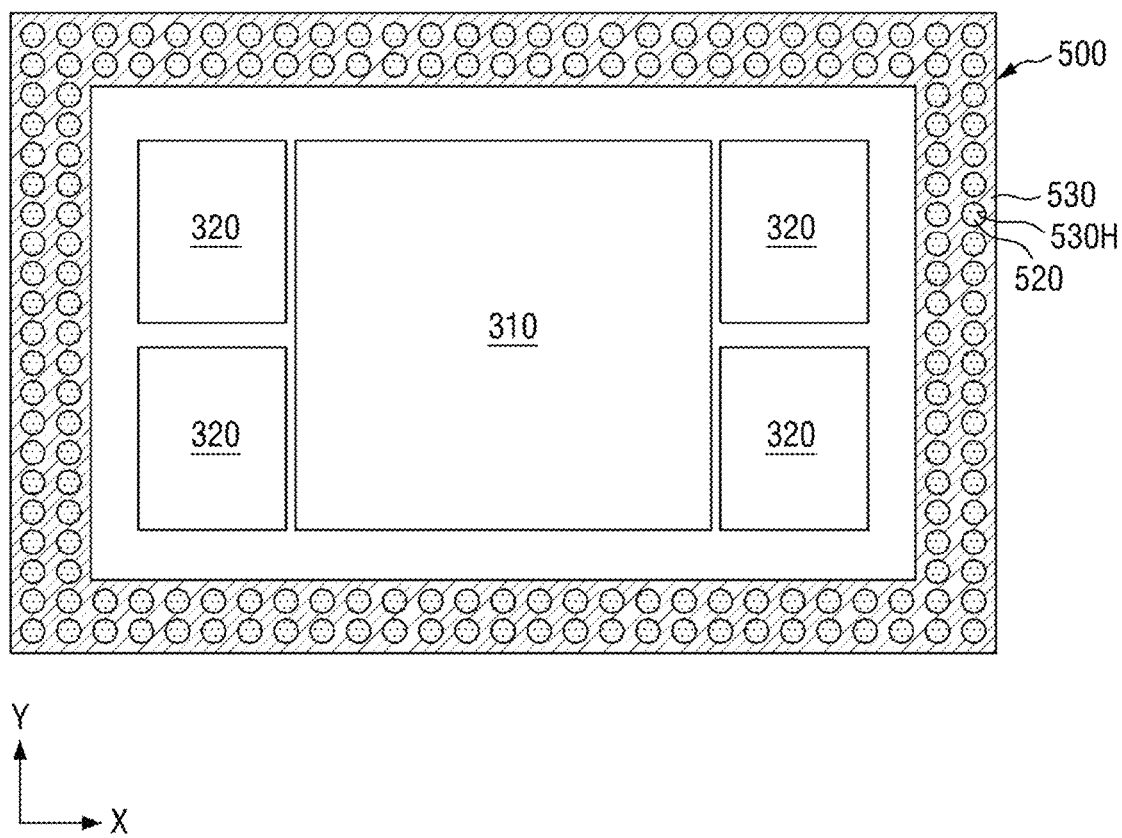
FIGS. 9 to 13 are various schematic layout views for explaining a semiconductor package according to some embodiments.

Referring to FIG. 9, in the semiconductor package according to some embodiments, the second metal layer 530 may include a plurality of first openings 530H.

In some embodiments, the plurality of first openings 530H may form a pattern inside the second metal layer 530. For example, as shown, the first openings 530H may form a plurality of circular patterns inside the second metal layer 530. A part of the upper side of the core layer 520 may be exposed from the second metal layer 530 through the first opening 530H.

The shape, size, arrangement, and the like of the first opening 530H are not limited to those shown and may of course change depending on the design. For example, the first opening 530H may have other forms such as a ring, an ellipse, an oblong, and/or or a polygon (e.g., a rectangle) from a planar viewpoint. Further, for example, a plurality of first openings 530H may be arranged in a lattice form, or may be arranged in a zigzag form to cross each other.

Figure 10:
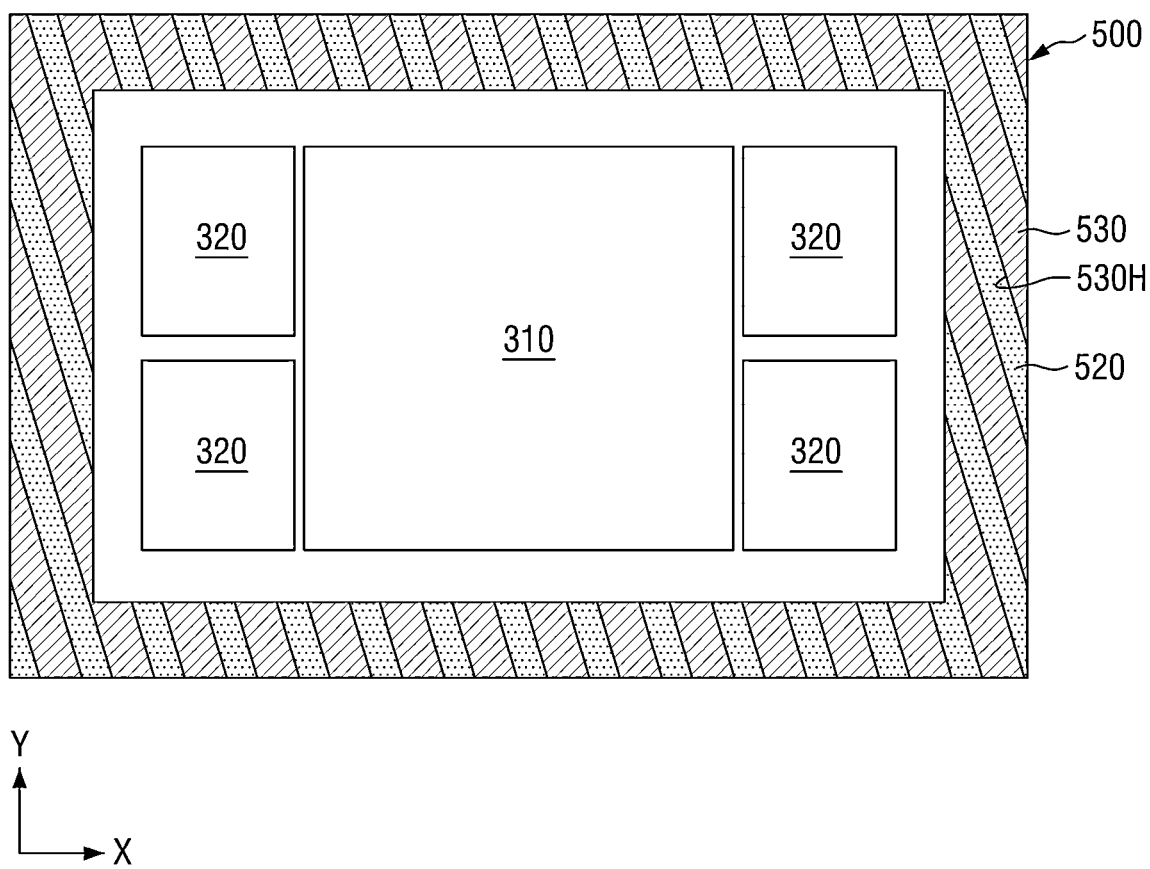

Referring to FIG. 10, in the semiconductor package according to some embodiments, the second metal layer 530 may form a plurality of linear patterns.

For example, as shown, the first openings 530H may form a plurality of linear patterns inside the second metal layer 530.

In some embodiments, each first opening 530H may extend in a direction different from the first direction X and the second direction Y. For example, each first opening 530H may extend in a direction which is oblique to the first direction X and the second direction Y.

Figure 11:
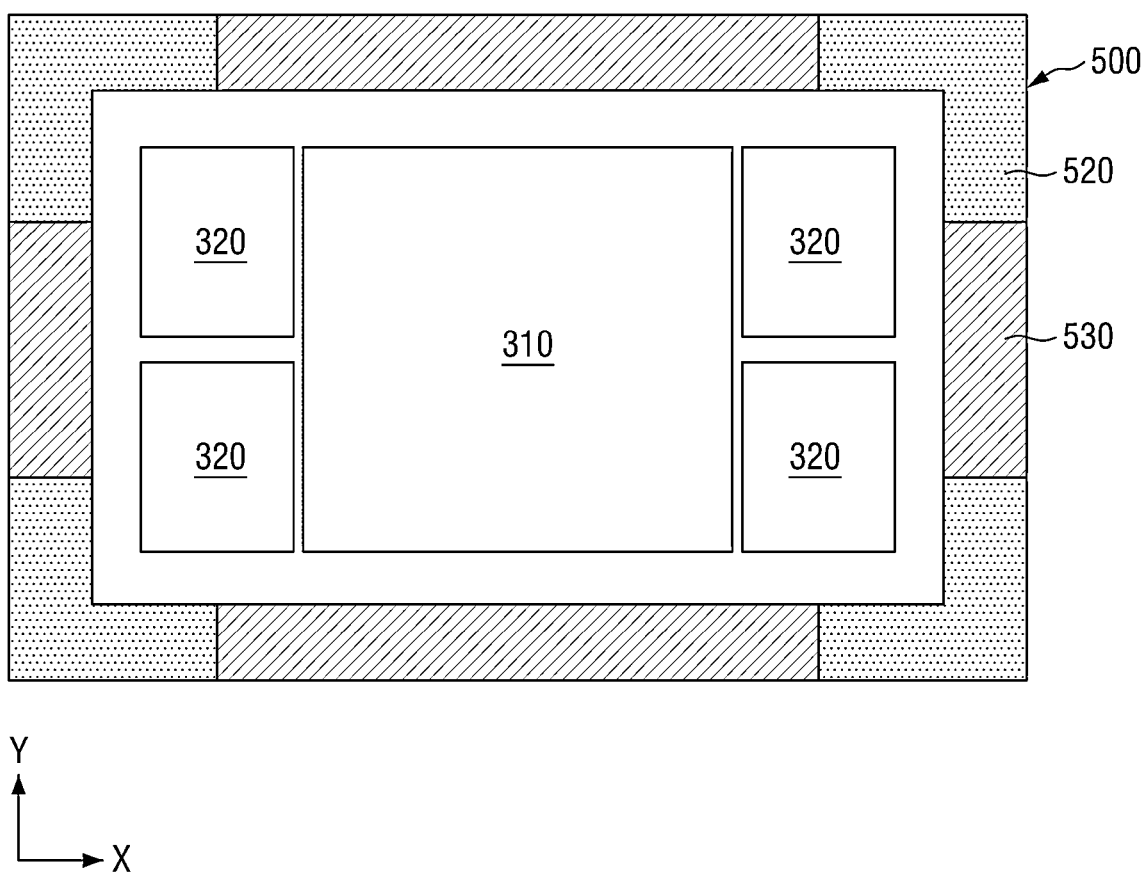
Figure 12:
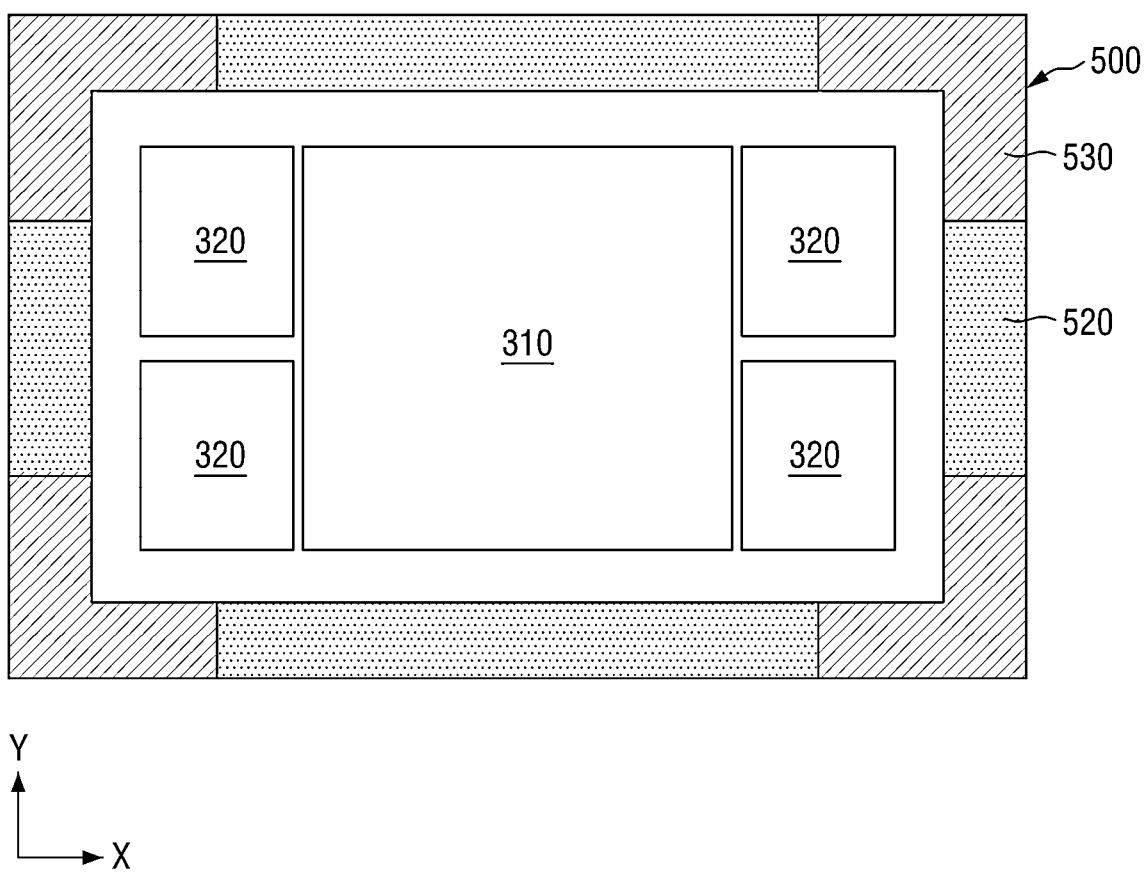

Referring to FIGS. 11 and 12, in the semiconductor package according to some embodiments, the second metal layer 530 may form a plurality of isolated regions.

For example, the second metal layer 530 is placed in a partial region of the core layer 520 placed around the semiconductor chips 310 and 320, and may not be placed in some other regions of the core layer 520.

In some embodiments, as shown in FIG. 11, the second metal layer 530 may be placed in relation to the side faces of the semiconductor chips 310 and 320, and may not be placed at the corners of the semiconductor chips 310 and 320. For example, the core layer 520 may include a first portion extending in the first direction X, and a second portion extending in the second direction Y. The second metal layer 530 may be placed on the first portion and the second portion, and may expose an intersecting region of the first portion and the second portion.

In some embodiments, as shown in FIG. 12, the second metal layer 530 may be placed at the corners of the semiconductor chips 310 and 320, and may not be placed on the sides of the semiconductor chips 310 and 320. For example, the second metal layer 530 may be placed on the intersecting region of the first portion and the second portion, and may expose the first portion and the second portion.

In FIGS. 9 to 12, although only the plurality of first openings 530H is shown to form a pattern, this is merely an example. Although not shown, the first metal layer (e.g., 510 of FIG. 7) may also include a plurality of second openings (e.g., 510H). The second openings 510H may form the same pattern as the first openings 530H, or may form patterns different from those of the first openings 530H. In some example embodiments, the plurality of second openings 510H may form a pattern, and the first metal layer 510 may not form a pattern.

Figure 13:
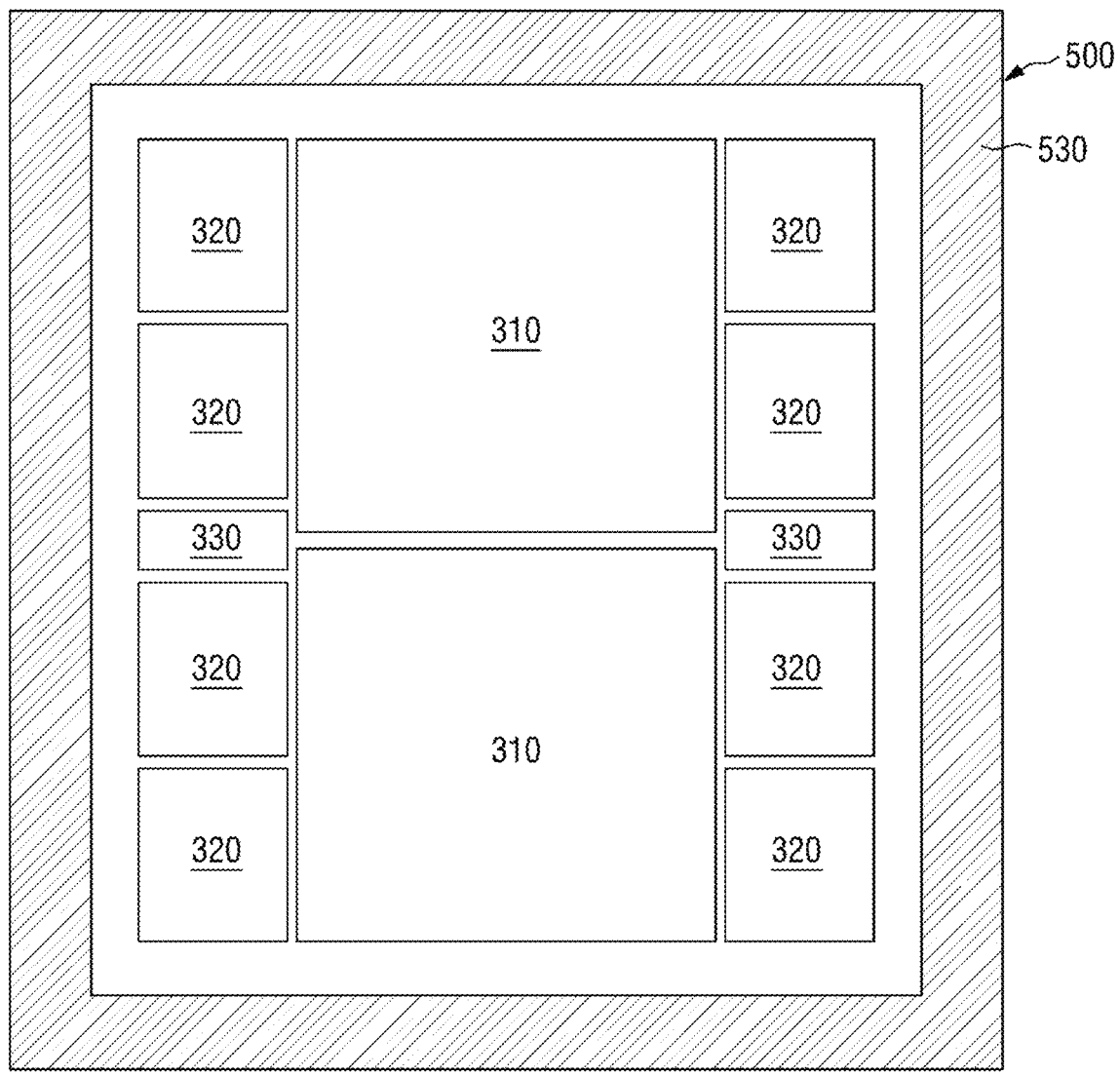

Referring to FIG. 13, in the semiconductor package according to some embodiments, the stiffener 500 may be placed around the plurality of first semiconductor chips 310.

As an example, as shown, the stiffener 500 may be placed around two first semiconductor chips 310. The plurality of first semiconductor chips 310 may be, for example, arranged along the second direction Y.

In some embodiments, the larger number of second semiconductor chips 320 than the first semiconductor chips 310 may be placed. As an example, as shown, a plurality of (e.g., four) second semiconductor chips 320 may be placed on both sides of each of the two first semiconductor chips 310.

In some embodiments, a dummy chip 330 may be placed. The dummy chip 330 may not function as the semiconductor chip. The dummy chip 330 may be arranged, for example, with the first semiconductor chips 310 along the first direction X. As an example, as shown, two first semiconductor chips 310 may be placed on both sides of the dummy chip 330.

Figure 14:
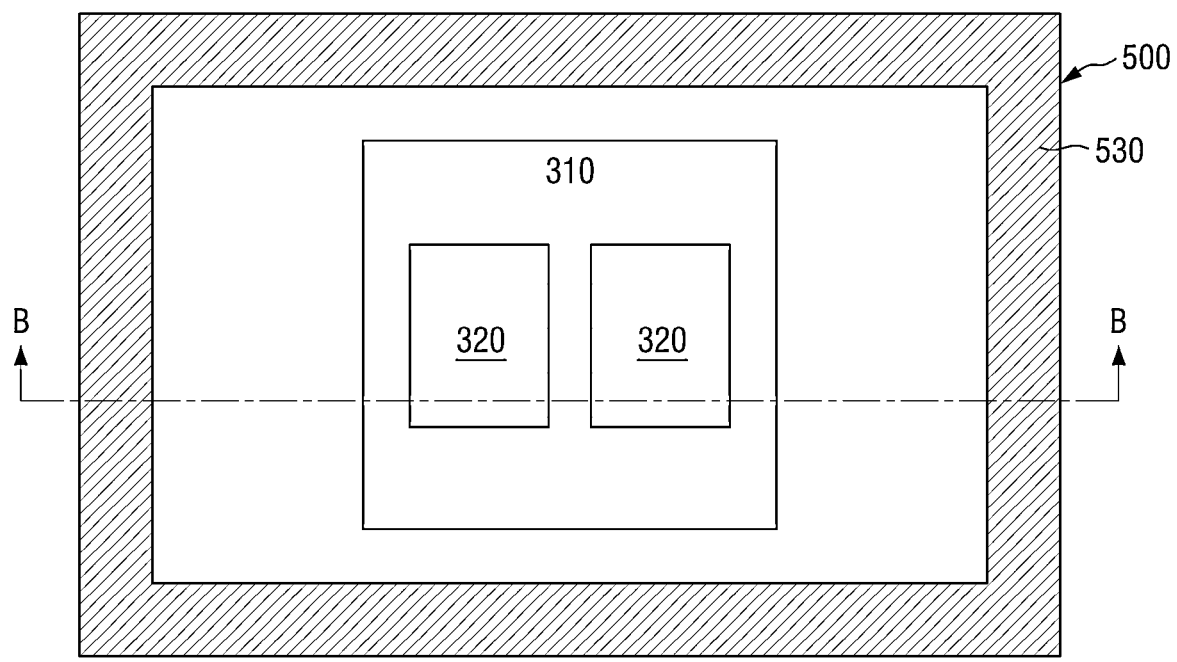
FIG. 14 is a schematic layout view of a semiconductor package according to some example embodiments.

FIG. 14 is a schematic layout view for explaining the semiconductor package according to some embodiments. FIG. 15 is a schematic cross-sectional view taken along B-B of FIG. 14. For convenience of explanation, repeated parts of contents explained above using FIGS. 1 to 13 will be briefly described or omitted.

Referring to FIGS. 14 and 15, in the semiconductor package according to some embodiments, the second semiconductor chip 320 may be placed on the upper side of the first semiconductor chip 310.

For example, a second circuit board 600 may be placed on the upper side of the first circuit board 100. The second circuit board 600 may be a packaging board. The second circuit board 600 may be a printed circuit board (PCB), a ceramic board, or the like. In some example embodiments, the second circuit board 600 may be a wafer level package (WLP) board fabricated at a wafer level. The second circuit board 600 may include a lower side and an upper side that are opposite to each other.

The second circuit board 600 may include a third board pad 602 and a fourth board pad 604. The third board pad 602 and the fourth board pad 604 may each be used to electrically connect the second circuit board 600 to other components. For example, the third board pad 602 may be exposed from the lower side of the second circuit board 600, and the fourth board pad 604 may be exposed from the upper side of the second circuit board 600. The third board pad 602 and the fourth board pad 604 may include a conductive material such as a metallic substance like, but not limited to, Sn, Au, Cu, Al, and/or an alloy thereof. Wiring patterns for electrically connecting the third board pad 602 and the fourth board pad 604 may be formed inside the second circuit board 600. The wiring patterns may include a conductive material, such as a metallic substance like, but not limited to, like Sn, Au, Cu, Al, and/or an alloy thereof.

The second circuit board 600 may be mounted on the upper side of the first circuit board 100. For example, the second connecting member 250 may connect the second board pad 104 and the third board pad 602. Accordingly, the first circuit board 100 and the second circuit board 600 may be electrically connected. In some embodiments, the stiffener 500 may be placed around the second circuit board 600.

In some embodiments, the first semiconductor chip 310 may be mounted on the upper side of the second circuit board 600. For example, the third connecting member 352 may connect the fourth board pad 604 and the first chip pad 312. The second circuit board 600 and the first semiconductor chip 310 may be electrically connected accordingly.

In some embodiments, a second molding member 410 may be formed on the upper side of the second circuit board 600. The second molding member 410 may be formed to cover at least a part of the first semiconductor chip 310. For example, the second molding member 410 may cover the first semiconductor chip 310 and the second underfill 362. The second molding member 410 may include, but is not limited to, an insulating polymeric substance such as EMC.

In some embodiments, the interposer 200 may be mounted on the second circuit board 600 and the first semiconductor chip 310. For example, a fifth connecting member 650 may be formed between the second circuit board 600 and the interposer 200. The fifth connecting member 650 may connect the fourth board pad 604 and the first interposer pad 202. Accordingly, the second circuit board 600 and the interposer 200 may be electrically connected. The number, interval, arrangement form, and the like of the fifth connecting member 650 are not limited to those shown, and may of course be various depending on the design.

The fifth connecting member 650 may be, but is not limited to, solder bumps. The solder may include, for example, a low-melting point conductive material. For example, the solder may include a metal (e.g., tin (Sn)) and/or an alloy (e.g., Sn and/or Cu alloys) with a low-melting point. The solder bump may include a eutectic alloy including the conductive material. In some embodiments, the fifth connecting member 650 may be formed inside the second molding member 410. For example, the second molding member 410 may include a molding home 410H that exposes at least a part of the fourth board pad 604. The fifth connecting member 650 may be formed in the molding groove 410H and may be connected to the fourth board pad 604. In some embodiments, the interposer 200 may be spaced apart from the upper side of the second molding member 410 by a fifth connecting member 650.

In some embodiments, the second semiconductor chip 320 may be mounted on the upper side of the interposer 200. For example, the fourth connecting member 354 may connect the second interposer pad 204 and the second chip pad 314. The interposer 200 and the second semiconductor chip 320 may be electrically connected accordingly.

In some embodiments, a third molding member 420 may be formed on the upper side of the interposer 200. The third molding member 420 may be formed to cover at least a part of the second semiconductor chip 320. For example, the third molding member 420 may cover the sides of the second semiconductor chip 320 and the third underfill 364. The third molding member 420 may include, but is not limited to, an insulating polymeric substance such as EMC.

In concluding the detailed description, those skilled in the art will appreciate that many variations and modifications may be made to the example embodiments without substantially departing from the principles of the present invention. Therefore, the disclosed example embodiments of the invention are used in a generic and descriptive sense only and not for purposes of limitation.

What is claimed is:

1. A semiconductor package comprising:
   a circuit board;
   a semiconductor chip on the circuit board;
   a stiffener disposed around the semiconductor chip, the stiffener including a first metal layer, a core layer, and a second metal layer sequentially stacked; and
   an adhesive layer attaching an upper surface of the circuit board to a bottom surface of the stiffener,
   wherein the stiffener is electrically insulated from the circuit board by an insulating material included in the adhesive layer.

2. The semiconductor package of claim 1, wherein the circuit board includes
   an insulating core including an organic matter, and
   a board pad exposed from the insulating core.

3. The semiconductor package of claim 2, wherein the core layer includes the same substance as the insulating core.

4. The semiconductor package of claim 1, wherein the second metal layer exposes a part of an upper side of the core layer.

5. The semiconductor package of claim 1, wherein a height of an upper side of the second metal layer from the upper surface of the circuit board is less than a height of an upper side of the semiconductor chip from the upper surface of the circuit board.

6. The semiconductor package of claim 1, wherein a thickness of the core layer is greater than a thickness of at least one of the first metal layer or the second metal layer.

7. The semiconductor package of claim 1, wherein the circuit board includes first and second surfaces which are opposite to each other, and
   the semiconductor chip and the stiffener are disposed on the first surface.

8. The semiconductor package of claim 1, wherein the stiffener further includes
   a third metal layer between the first metal layer and the circuit board, and
   an insulating layer between the first metal layer and the third metal layer.

9. The semiconductor package of claim 1, wherein the core layer includes a pre-preg.

10. The semiconductor package of claim 1, wherein at least one of the first metal layer or the second metal layer includes copper (Cu).

11. A semiconductor package comprising:
    a circuit board;
    an interposer on an upper side of the circuit board;
    a first semiconductor chip on an upper side of the interposer;
    a second semiconductor chip on the upper side of the interposer, the second semiconductor chip isolated from direct contact with the first semiconductor chip;
    a stiffener around the interposer on the upper side of the circuit board, the stiffener including a first metal layer, a core layer, and a second metal layer sequentially stacked; and
    an adhesive layer attaching the upper side of the circuit board to a bottom surface of the stiffener,
    wherein the stiffener is disposed on the circuit board,
    the circuit board includes the upper surface and a second surface which are opposite to each other, and
    the first and second semiconductor chips and the stiffener are disposed on the upper side, and
    the stiffener is electrically insulated from the circuit board by an insulating material included in the adhesive layer.

12. The semiconductor package of claim 11, wherein the circuit board includes an insulating core and a board pad exposed from the insulating core, and
    the core layer and the insulating core each include an organic matter.

13. The semiconductor package of claim 11, wherein the stiffener includes a copper clad laminate (CCL).

14. The semiconductor package of claim 11, wherein the interposer includes
    a semiconductor film,
    a penetration via in the semiconductor film,
    an interlayer insulating film on an upper side of the semiconductor film, and
    a redistribution pattern in the interlayer insulating film, the redistribution pattern connected to the penetration via.

15. The semiconductor package of claim 11, wherein
    the first semiconductor chip includes a logic semiconductor chip, and
    the second semiconductor chip includes a memory semiconductor chip.

16. A semiconductor package comprising:
    a first circuit board;
    a second circuit board disposed on the first circuit board;
    a first semiconductor chip on an upper side of the second circuit board;
    an interposer on the upper side of the second circuit board and the first semiconductor chip;
    a second semiconductor chip on an upper side of the interposer;
    a stiffener around the second circuit board, the stiffener including a first metal layer, a core layer, and a second metal layer sequentially stacked; and
    an adhesive layer attaching an upper surface of the first circuit board to a bottom surface of the stiffener.

17. The semiconductor package of claim 16, further comprising:
    a connecting member which electrically connects the second circuit board and the interposer.

18. The semiconductor package of claim 16, wherein
    the circuit board includes the upper surface and a second surfaces which are opposite to each other, and
    the first semiconductor chip and the stiffener are disposed on the upper surface.

19. The semiconductor package of claim 16, wherein the stiffener includes a copper clad laminate (CCL).

* * * * *